(12) United States Patent
Ishigo (10) Patent No.: US 9,250,542 B2
(45) Date of Patent: Feb. 2, 2016

(54) OVERLAY/ALIGNMENT MEASUREMENT METHOD AND OVERLAY/ALIGNMENT MEASUREMENT APPARATUS

(75) Inventor: Kazutaka Ishigo, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 340 days.

(21) Appl. No.: 13/051,460

(22) Filed: Mar. 18, 2011

(65) Prior Publication Data

US 2012/0069337 A1   Mar. 22, 2012

(30) Foreign Application Priority Data

Sep. 22, 2010   (JP) ................................ 2010-212542

(51) Int. Cl.
*G01B 11/00* (2006.01)
*G03F 7/20* (2006.01)
*G03F 9/00* (2006.01)

(52) U.S. Cl.
CPC .......... *G03F 7/70633* (2013.01); *G03F 9/7046* (2013.01); *G03F 9/7088* (2013.01)

(58) Field of Classification Search
CPC ................................................. G03F 7/70633
USPC ........................................................ 356/401
See application file for complete search history.

(56) References Cited

U.S. PATENT DOCUMENTS

| | | | |
|---|---|---|---|
| 6,879,868 B2 * | 4/2005 | Mos et al. ...................... | 700/114 |
| 7,433,039 B1 * | 10/2008 | Levinski et al. .............. | 356/401 |
| 2005/0157296 A1 * | 7/2005 | Hayano ......................... | 356/401 |
| 2006/0151890 A1 * | 7/2006 | Smith et al. .................... | 257/797 |
| 2007/0002323 A1 * | 1/2007 | Fukui et al. .................... | 356/401 |
| 2008/0049203 A1 | 2/2008 | Mishima | |
| 2008/0206898 A1 | 8/2008 | Fukuhara et al. | |
| 2009/0231569 A1 * | 9/2009 | Maeda ............................ | 355/77 |
| 2009/0291513 A1 * | 11/2009 | Ghinovker et al. ............. | 438/16 |
| 2010/0291477 A1 | 11/2010 | Ishigo | |

FOREIGN PATENT DOCUMENTS

| | | |
|---|---|---|
| JP | 2006-332480 | 12/2006 |
| JP | 2007-184343 | 7/2007 |
| JP | 2008-53618 | 3/2008 |
| JP | 2009-212276 | 9/2009 |

* cited by examiner

*Primary Examiner* — Tarifur Chowdhury
*Assistant Examiner* — Omar Nixon
(74) *Attorney, Agent, or Firm* — Finnegan, Henderson, Farabow, Garrett & Dunner, L.L.P.

(57) ABSTRACT

According to one embodiment, a method includes preliminarily measuring the amount of overlay or alignment shift of the mark for overlay or alignment measurement while sequentially shifting a position of a measurement area relative to the mark for overlay or alignment measurement so as to position the mark for overlay or alignment measurement on each of a plurality of partial areas. The measurement area corresponds to a field angle of the optical measurement system, and an inside of the measurement area is two-dimensionally divided into the partial areas. The method includes calculating a tool-induced shift regarding a characteristic deviation of the optical measurement system for each of the plurality of partial areas based on a preliminarily measured result of the amount of overlay or alignment shift. The method includes determining a partial area to be used from among the plurality of partial areas on the basis of the tool-induced shift calculated for each of the plurality of partial areas.

15 Claims, 5 Drawing Sheets

| A1 | B1 | C1 | D1 | E1 |
| --- | --- | --- | --- | --- |
| A2 | B2 | C2 | D2 | E2 |
| A3 | B3 | C3 | D3 | E3 |
| A4 | B4 | C4 | D4 | E4 |
| A5 | B5 | C5 | D5 | E5 |

| AREA | REPEATABILITY | TOOL-INDUCED SHIFT (TIS) | TOOL MATCHING (Mat) | MEASUREMENT UNCERTAINTY (TMU) |
|---|---|---|---|---|
| A1 | Rep (A1) | TIS (A1) | Mat (A1) | TMU (A1) |
| A2 | Rep (A2) | TIS (A2) | Mat (A2) | TMU (A2) |
| A3 | Rep (A3) | TIS (A3) | Mat (A3) | TMU (A3) |
| ⋮ | | | | |
| E3 | Rep (E3) | TIS (E3) | Mat (E3) | TMU (E3) |
| E4 | Rep (E4) | TIS (E4) | Mat (E4) | TMU (E4) |
| E5 | Rep (E5) | TIS (E5) | Mat (E5) | TMU (E5) |

OVERLAY/ALIGNMENT MEASUREMENT METHOD AND OVERLAY/ALIGNMENT MEASUREMENT APPARATUS

CROSS-REFERENCE TO RELATED APPLICATIONS

This application is based upon and claims the benefit of priority from the prior Japanese Patent Application No. 2010-212542, filed on Sep. 22, 2010; the entire contents of which are incorporated herein by reference.

FIELD

Embodiments described herein relate generally to an overlay/alignment measurement method and an overlay/alignment measurement apparatus.

BACKGROUND

In an image-based overlay measurement apparatus, with the decrease in the size of a measurement subject device, the requirement for the accuracy in overlay has intensified. Therefore, the number of sampling points has been increasing to perform accurate overlay measurement. In a case of disposing a mark for overlay measurement on a reticle used in a lithographic process, the mark is disposed on a scribe line in a shot area. With the heightened demand for the accuracy in overlay measurement, marks for overlay measurement that need to be disposed in the shot area are increasing in number. In order to increase the number of marks disposable on the scribe line, it is necessary to reduce the size of each mark for overlay measurement.

The image-based overlay measurement apparatus uses an optical microscope to perform overlay measurement. Therefore, if the size of the mark for overlay measurement is reduced, the lens aberration of an optical microscope is likely to influence the accuracy of overlay measurement. Specifically, in a case where the optical microscope (optical measurement system) has comatic aberration which is odd function aberration, there is a possibility that an optical image of the mark for overlay measurement will shift, thereby increasing an error of the overlay measurement.

DETAILED DESCRIPTION

In general, according to one embodiment, there is provided an overlay or alignment measurement method of measuring an amount of overlay or alignment shift by acquiring an optical image of a mark for overlay or alignment measurement formed on a substrate by an optical measurement system. The method includes preliminarily measuring the amount of overlay or alignment shift of the mark for overlay or alignment measurement while sequentially shifting a position of a measurement area relative to the mark for overlay or alignment measurement so as to position the mark for overlay or alignment measurement on each of a plurality of partial areas. The measurement area corresponds to a field angle of the optical measurement system, and an inside of the measurement area is two-dimensionally divided into the partial areas. The method includes calculating a tool-induced shift regarding a characteristic deviation of the optical measurement system for each of the plurality of partial areas based on a preliminarily measured result of the amount of overlay or alignment shift. The method includes determining a partial area to be used from among the plurality of partial areas on the basis of the tool-induced shift calculated for each of the plurality of partial areas. The method includes measuring an amount of overlay or alignment shift of the mark for overlay or alignment measurement in a state in which the position of the measurement area relative to the mark for overlay or alignment measurement is set such that the mark for overlay or alignment measurement is located on the partial area determined to be used.

Hereinafter, an overlay or alignment measurement apparatus according to an embodiment will be described in detail with reference to the accompanying drawings. The present invention is not limited by this embodiment.

Embodiment

Figure 1:
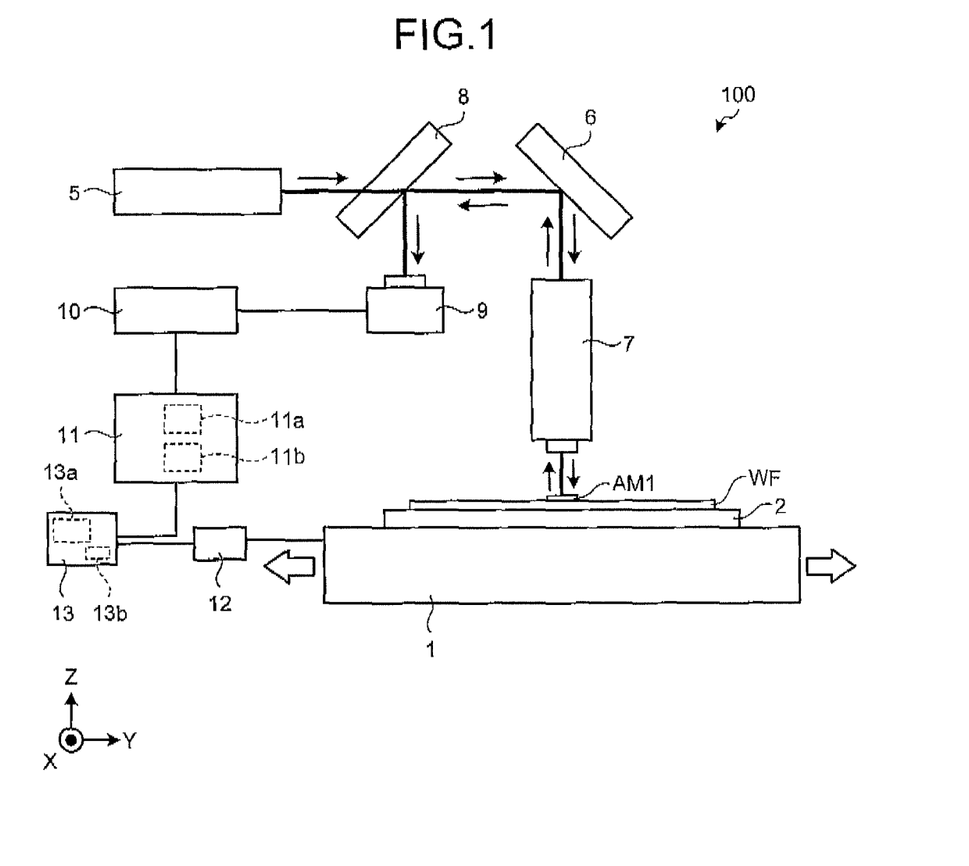
FIG. 1 is a diagram illustrating the configuration of an overlay or alignment measurement apparatus according to an embodiment.

An overlay or alignment measurement apparatus 100 according to an embodiment will be described with reference to FIG. 1. FIG. 1 is a diagram illustrating the schematic configuration of the overlay or alignment measurement apparatus 100.

The overlay or alignment measurement apparatus 100 includes a wafer stage (substrate stage) 1, a driver 12, a light source 5, an optical prism 8, an optical mirror 6, an optical microscope (optical measurement system) 7, a CCD detector 9, an image processing device 10, a process operation device 11, and a controller 13.

On the wafer stage 1, a wafer (substrate) WF is mounted. Specifically, the wafer stage 1 includes a platen (not shown), a coarsely movable stage (not shown), a finely movable stage (not shown), and a wafer chuck 2. The platen is fixed to a main body (not shown) of the overlay or alignment measurement apparatus. The coarsely movable stage is disposed on the platen and is driven on the platen, for example, in six directions (an X direction, a Y direction, a Z direction, a rotation direction around an X axis, a rotation direction around a Y axis, and a rotation direction around a Z axis). The finely movable stage is disposed on the coarsely movable stage and is driven on the coarsely movable stage, for example, in the six directions (the X direction, the Y direction, the Z direction, the rotation direction around the X axis, the rotation direction around the Y axis, and the rotation direction around the Z axis) with a shorter stroke and higher accuracy than the coarsely movable stage. The wafer chuck 2 is disposed on the finely movable stage and sticks to the wafer WF when the wafer WF is mounted. In this way, the wafer stage 1 holds the wafer WF via the wafer chuck 2.

Figure 3A:
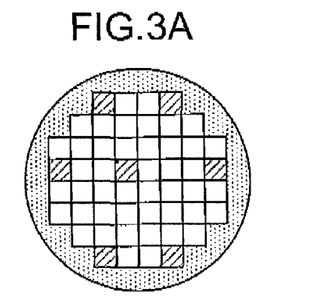
FIGS. 3A to 3E are diagrams illustrating an overlay or alignment measurement method according to an embodiment.
Figure 3B:
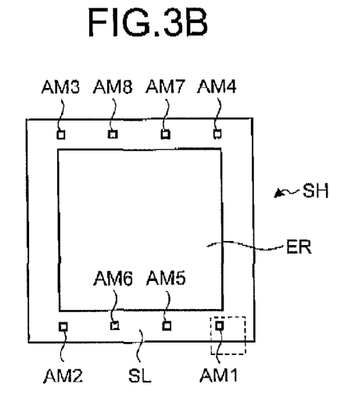

The wafer WF has the surface on which patterns of a plurality of layers L1 and L2 are stacked. Further, in the wafer WF including a plurality of shot areas SH (see FIG. 3A), a plurality of marks for overlay or alignment measurement (alignment marks) AM1 to AM8 are formed in each of the shot areas SH. That is, in each shot area SH, as shown in FIG. 3B, on a scribe line SL around an exposure area ER where a circuit element pattern will be formed, the plurality of marks for overlay or alignment measurement AM1 to AM8 are formed.

Figure 3C:
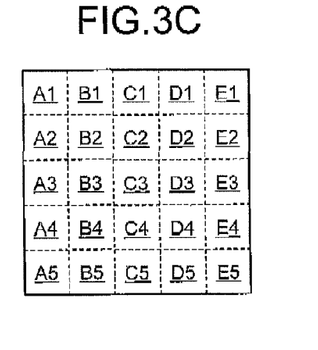

Each of the marks for overlay or alignment measurement AM1 to AM8 includes marks of the plurality of layers L1 and L2, and is used to measure the amount of overlay shift between the layers. For example, as shown in FIG. 3E, the mark for overlay or alignment measurement AM1 includes marks L1X1 and L1X2 of the layer L1 for measuring an overlay shift in the X direction, marks L1Y1, L1Y2 of the layer L1 for measuring an overlay shift in the Y direction, marks L2X1 and L2X2 of the layer L2 for measuring the overlay shift in the X direction, and marks L2Y1 and L2Y2 of the layer L2 for measuring the overlay shift in the Y direction.

The driver 12 shown in FIG. 1 receives a control signal from the controller 13. According to the control signal, the driver 12 drives the wafer stage 1, for example, in each of the six directions (the X direction, the Y direction, the Z direction, the rotation direction around the X axis, the rotation direction around the Y axis, and the rotation direction around the Z axis). Specifically, the driver 12 includes a first movable element (not shown) provided on one side of the platen and the coarsely movable stage, a first oscillator (not shown) provided on the other side of the platen and the coarsely movable stage, a second movable element (not shown) provided on one side of the coarsely movable stage and the finely movable stage, and a second oscillator (not shown) provided on the other side of the coarsely movable stage and the finely movable stage.

The controller 13 causes the driver 12 to drive the wafer stage 1 to a predetermined target position.

The light source 5 generates light and emits the generated light toward the optical prism 8. The light source 5 is, for example, a xenon lamp or a halogen lamp.

The optical prism 8 is disposed among the light source 5, the optical mirror 6, and the CCD detector 9 on a optical path. The optical prism 8 functions as a half mirror which permits transmission of the light emitted from the light source 5 to guide the light to the optical mirror 6, and reflects light guided from the optical mirror 6 to further guide the light to the CCD detector 9.

The optical mirror 6 is disposed between the optical prism 8 and the optical microscope 7 on the optical path. The optical mirror 6 reflects the light guided from the optical prism 8 so as to guide the light to the optical microscope 7, and reflects light guided from the optical microscope 7 so as to guide the light to the optical prism 8.

The optical microscope 7 is disposed between the optical mirror 6 and the wafer stage 1 on the optical path. The optical microscope 7 includes a lens (not shown) and receives the light guided from the optical mirror 6 by means of the lens to concentrate the light on the mark for overlay or alignment measurement AM1 on the wafer WF. Further, the optical microscope 7 receives light diffracted by the mark for overlay or alignment measurement AM1 by means of the lens, and forms en optical image of the mark for overlay or alignment measurement AM1 on an imaging surface of the CCD detector 9 through the optical mirror 6 and the optical prism 8.

A similar process is applied to each of the other marks for overlay or alignment measurement AM2 to AM8. Further, FIG. 1 exemplarily shows a case where the optical microscope 7 is an off-axis type provided independently from an optical projection system (not shown). However, the optical microscope 7 may be a through-the-lens (TTL) type for performing overlay or alignment measurement by an optical system through the optical projection system.

The CCD detector 9 acquires the optical image formed on the imaging surface and generates an image signal (analog signal). The COD detector 9 provides the generated image signal to the image processing device 10.

Further, as long as it is possible to acquire the optical image formed on the imaging surface, other types of image sensors (for example, a CMOS image sensor) may be used instead of the CCD detector (COD image sensor) 9.

The image processing device 10 receives the image signal from the CCD detector 9. The image processing device 10 performs predetermined analog signal processing on the received image signal and then performs analog-to-digital conversion processing on the processed image signal (analog signal) so as to generates an image signal (digital signal). Then, the image processing device 10 performs predetermined digital signal processing on the image signal (digital signal) so as to generate image data, calculates data (waveform data) necessary for overlay or alignment measurement from the image data through image processing such as edge detection or the like, and provides the waveform data to the process operation device 11. Further, the image processing device 10 provides the image data to the process operation device 11.

The process operation device 11 receives the waveform data and the image data from the image processing device 10. On the basis of the waveform data, the process operation device 11 calculates the amount of overlay shift between the layers.

Next, the internal configurations and operations of the controller 13 and the process operation device 11 will be described.

The controller 13 includes a measurement controller 13a and a storage unit 13b.

The measurement controller 13a selects, for example, seven shot areas SH (shot areas shown in FIG. 3A by diagonal lines) from the plurality of shot areas SH in the wafer WF, as shot areas SH for overlay or alignment measurement, and drives the wafer stage 1 with the driver 12 so as to position an optical axis of the optical microscope 7 in one shot area SH selected from the seven shot areas SH.

Then, the measurement controller 13a selects a mark for overlay or alignment measurement (for example, AM1) to be used for overlay or alignment measurement, from the plurality of marks for overlay or alignment measurement AM1 to AM8 in the shot area SH, and causes the driver 12 to drive the wafer stage 1 so as to position the optical axis of the optical microscope 7 in the selected mark for overlay or alignment measurement AM1. That is, the measurement controller 13a causes the driver 12 to drive the wafer stage 1 so as to position the mark for overlay or alignment measurement AM1 in the measurement area as shown in FIG. 3B by a broken line.

Specifically, the measurement area is an area corresponding to the field angle of the optical microscope 7, and is, for example, a rectangular area (area shown in FIGS. 4A and 4B by broken lines) corresponding to a measurement view of the optical microscope 7. The measurement area includes, for example, a plurality of partial areas A1 to A5, B1 to B5, C1 to C5, D1 to D5, and E1 to E5, each being a fraction obtained by two-dimensionally dividing the inside of the measurement area, as shown in FIG. 3C. That is, the inside of the Measurement area is two-dimensionally divided according to the size of the marks for overlay or alignment measurement. For example, in a case where the size of the measurement area is 50 μm×50 μm and the size of each mark for overlay or alignment measurement is 10 μm×10 μm, the inside of the measurement area is divided into 5×5 partial areas.

Further, the partial areas do not need to be completely separated from each other but may overlap each other. For example, the measurement area may be divided such that the partial areas overlap each other by half of the size of the mark, like a case where the measurement field angle is 50 the size of the mark is 10 μm, and the number of partial areas is 10×10.

The measurement controller 13a sequentially causes the driver 12 to drive the wafer stage 1 to position the mark for overlay or alignment measurement AM1 on each of the plurality of partial area A1 to E5. Specifically, the measurement controller 13a causes the driver 12 to rotate the wafer stage 1 around the Z axis so as to direct a notch (a notched portion of the wafer WF) downward (see FIG. 4A), and then moves the wafer stage 1 in the X direction and the Y direction to position the mark AM1 on each of the partial areas A1 to E5. Further, the measurement controller 13a causes the driver 12 to rotate the wafer stage 1 180 degrees around the Z axis from the state in which the notch is directed downward (see FIG. 4A), so as to direct the notch upward (see FIG. 4B). In the state in which the notch is directed upward (see FIG. 4B), the measurement controller 13a causes the driver 12 to move the wafer stage 1 in the X direction and the Y direction so as to position the mark for overlay or alignment measurement AM1 on each of the partial areas A1 to E5. In this way, with respect to the state in which the notch is directed upward and the state in which the notch is directed downward, the measurement controller 13a preliminarily control measurement of the amount of overlay or alignment shift of the mark for overlay or alignment measurement AM1 for each of the plurality of partial areas A1 to E5 a plurality of times while sequentially shifting the relative position of the measurement area to the mark AM1 for overlay or alignment measurement.

Figure 3D:
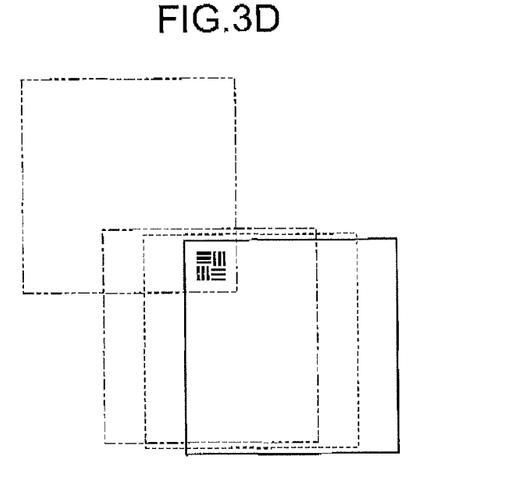
Figure 3E:
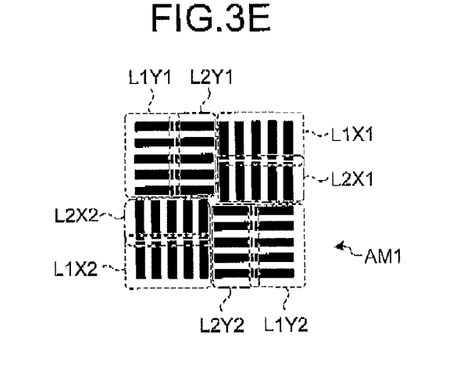

For example, with respect to each of the state in which the notch is directed downward (see FIG. 4A) and the state in which the notch is directed upward (see FIG. 4B), the measurement controller 13a causes the driver 12 to drive the wafer stage 1 so as to position the mark for overlay or alignment measurement AM1 on the partial area A1 as shown in FIG. 3D by a solid line. In this way, the measurement controller 13a preliminarily control measurement of the amount of overlay or alignment shift of the mark for overlay or alignment measurement AM1 for the partial area A1 the plurality of times.

For example, with respect to each of the state in which the notch is directed downward (see FIG. 4A) and the state in which the notch is directed upward (see FIG. 4B), the measurement controller 13a causes the driver 12 to drive the wafer stage 1 so as to position the mark for overlay or alignment measurement AM1 on the partial area 31 as shown in FIG. 3D by a broken line. In this way, the measurement controller 13a preliminarily control measurement of the amount of overlay or alignment shift of the mark for overlay or alignment measurement AM1 for the partial area B1 the plurality of times.

For example, with respect to each of the state in which the notch is directed downward (see FIG. 4A) and the state in which the notch is directed upward (see FIG. 4B), the measurement controller 13a causes the driver 12 to drive the wafer stage 1 so as to position the mark for overlay or alignment measurement AM1 on the partial area A1 as shown in FIG. 3D by a dashed-dotted line. In this way, the measurement controller 13a preliminarily control measurement of the amount of overlay or alignment shift of the mark for overlay or alignment measurement AM1 for the partial area C1 the plurality of times.

For example, with respect to each of the state in which the notch is directed downward (see FIG. 4A) and the state in which the notch is directed upward (see FIG. 4B), the measurement controller 13a causes the driver 12 to drive the wafer stage 1 so as to position the mark for overlay or alignment measurement AM1 on the partial area E5 as shown in FIG. 3D by a dashed-two dotted line. In this way, the measurement controller 13a preliminarily control measurement of the amount of overlay or alignment shift of the mark for overlay or alignment measurement AM1 for the partial area E5 the plurality of times.

The storage unit 13b stores an overlay or alignment measurement recipe. The overlay or alignment measurement recipe includes a measurement condition and a measurement process of a case of performing overlay or alignment measurement.

The process operation device 11 includes an operation unit 11a and a determining unit 11b.

The operation unit 11a calculates a tool-induced shift for each of the plurality of partial areas A1 to E5, on the basis of the amount of overlay or alignment shift preliminarily measured with respect to each of the state in which the notch is directed downward (see FIG. 4A) and the state in which the notch is directed upward (see FIG. 4B) under the control of the measurement controller 13a as described above. The tool-induced shift is an error component regarding a deviation in the characteristic of the optical microscope (optical measurement system) 7. For example, the tool-induced shift (TIS) is an error component regarding coma aberration of the lens (not shown) in the optical microscope. For example, the operation unit 11a calculates each of the TIS(A1) to TIS(E5) of the plurality of partial areas A1 to E5 (see FIG. 5).

Specifically, with respect to each of the partial areas A1 to E5, if the amount of overlay or alignment shift measured in the state in which the notch is directed downward is $E(0)$, and the amount of overlay or alignment shift measured in the state in which the wafer rotates 180° around the Z axis from the state in which the notch is directed downward (the notch is directed upward) is $E(180)$, the operation unit 11a calculates the TIS by the following Equation 1.

$$TIS=\{E(0)+E(180)\}/2 \qquad \text{(Equation 1)}$$

Further, the operation unit 11a calculates repeatability for each of the plurality of partial areas A1 to E5, on the basis of the amount of overlay or alignment shift preliminarily measured the plurality of times under the control of the measurement controller 13a as described above (see FIG. 5). The repeatability is an error component regarding the reproducibility of the amount of overlay or alignment shift. For example, the repeatability (Rep) is an error component in which a distribution of the measured values calculated by measuring the amount of overlay or alignment shift the plurality of times is $3\sigma$ (three times a standard deviation). For example, the operation unit 11a calculates each of Rep(A1) to Rep(E5) of the plurality of partial areas A1 to E5 (see FIG. 5).

Further, the operation unit 11a calculates a tool matching for each of the plurality of partial areas A1 to E5, on the basis of an amount of overlay or alignment shift measured by a reference optical measurement system (not shown) in advance, and the amount of overlay or alignment shift preliminarily measured under the control of the measurement controller 13a as described above. The reference optical measurement system is an optical measurement system provided to a reference overlay or alignment measurement apparatus (apparatus No. 1). For example, information on the amount of overlay or alignment shift measured by the reference optical measurement system may be inquired to and received from the reference overlay or alignment measurement apparatus via a communication line through a communication interface (not shown), or may be input by a user through a user interface (not shown). The tool matching is an error component regarding a deviation amount of the measurement controller 13a relative to the reference optical measurement system. For example, the tool matching (Mat) is expressed by a difference between a measured value of the amount of overlay or alignment shift by the reference optical measurement system and a measured value of the amount of overlay or alignment shift by the measurement controller 13a in the case of measuring the same mark for overlay or alignment measurement. For example, the operation unit 11a calculates each of Mat(A1) to Mat(E5) of the plurality of partial areas A1 to E5 (see FIG. 5).

Further, in a case where there is only one overlay or alignment measurement apparatus, that is, in a case where there is only one overlay or alignment measurement apparatus with an optical measurement system, the Mat is 0.

Figure 5:
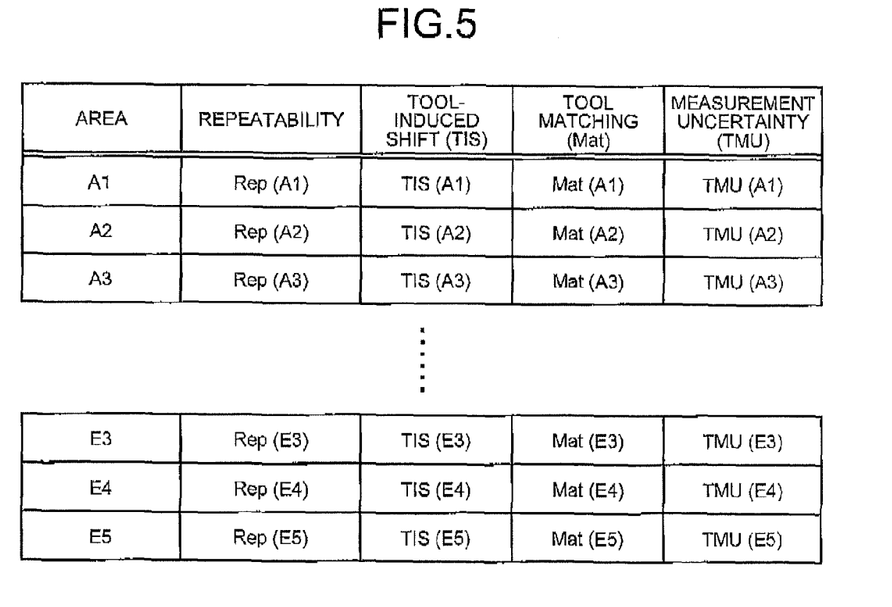
FIG. 5 is a diagram illustrating an overlay or alignment measurement method according to an embodiment.

Furthermore, the operation unit 11a calculates a total measurement uncertainty from at least the tool-induced shift and the repeatability, as a determination indicator of the accuracy of measurement for each of the plurality of partial areas A1 to E5 (see FIG. 5). The total measurement uncertainty is a total error in overlay or alignment measurement. For example, the total measurement uncertainty (TMU) is calculated by totally combining the above-mentioned individual error components in overlay or alignment measurement.

Specifically, when measured values of the TIS, the Rep, and the Mat for each of the partial areas A1 to E5 are TIS, Rep, and Mat, respectively, the operation unit 11a calculates the TMU by the following Equation 2.

$$TMU = \sqrt{(TIS)^2 + (Rep)^2 + (Mat)^2} \quad \text{(Equation 2)}$$

The TMU is an indicator corresponding to each of the TIS, the Rep, and the Mat.

Further, in a case where there is only one overlay or alignment measurement apparatus, that is, in a case where there is only one overlay or alignment measurement apparatus with an optical measurement system, the Mat is 0. Therefore, the operation unit 11a calculates the TMU by the following Equation 3.

$$TMU = \sqrt{(TIS)^2 + (Rep)^2} \quad \text{(Equation 3)}$$

The determining unit 11b determines a partial area with the smallest total measurement uncertainty (TMU) from the plurality of partial areas A1 to E5, as a partial area to be used. For example, in a case where the TMU(E5) is the smallest among the total measurement uncertainties TMU(A1) to TMU(E5) corresponding to the plurality of partial areas A1 to E5, the determining unit 11b determines the partial area E5 corresponding to the TMU(E5) as the partial area to be used. The determining unit 11b provides information on the partial area to be used to the controller 13.

Therefore, the controller 13 receives the information on the partial area to be used from the determining unit 11b, and updates the overlay or alignment measurement recipe stored in the storage unit 13b according to the information on the partial area to be used. Then, when measuring the amount of overlay shift between the layers, the measurement controller 13a drives the wafer stage 1 so as to position the mark for overlay or alignment measurement on the partial area determined to be used (for example, the partial area E5) (for example, such that a relative position relationship shown in FIG. 3D by the dashed-two dotted line is established) with reference to the updated overlay or alignment measurement recipe stored in the storage unit 13b. Therefore, the measurement controller 13a causes the drive 12 to shift the relative position of the measurement area to the mark for overlay or alignment measurement so as to position the mark for overlay or alignment measurement on the partial area determined to be used, and then controls measurement of the amount of overlay or alignment shift of the mark for overlay or alignment measurement.

Figure 2:
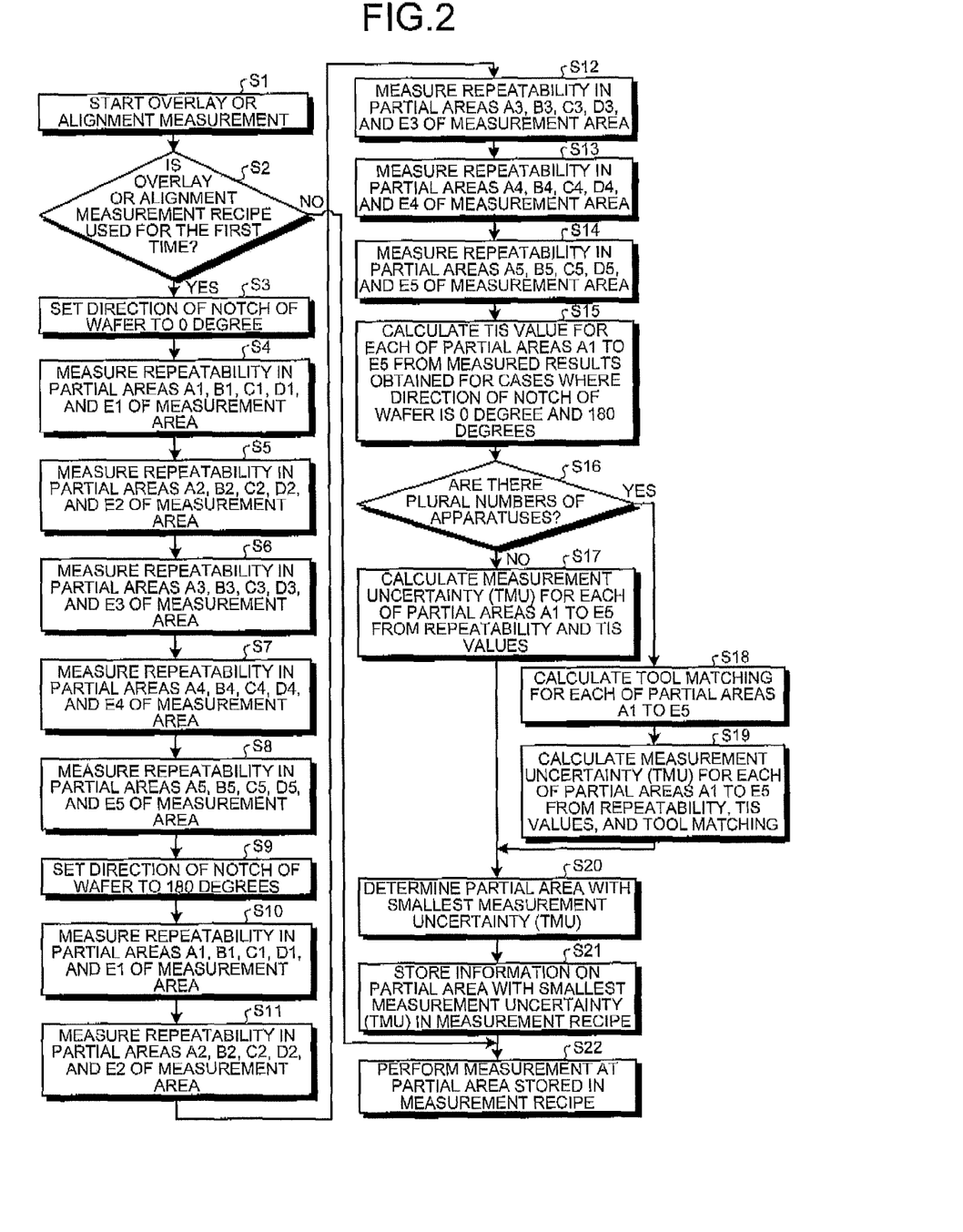
FIG. 2 is a flow chart illustrating an overlay or alignment measurement method according to an embodiment.

Next, an overlay or alignment measurement method according to an embodiment will be described with reference to FIG. 2. FIG. 2 is a flow chart illustrating an overlay or alignment measurement method according to an embodiment.

In step S1, the controller 13 receives an overlay or alignment measurement start command and starts an overlay or alignment measurement process. The overlay or alignment measurement start command may be input by a user through a user interface (not shown), or may be input from a controller of an exposing device (not shown) or an external controller via a communication line through a communication interface (not shown).

In step S2, the controller 13 determines whether the overlay or alignment measurement recipe is used for the first time or not, with reference to the overlay or alignment measurement recipe stored in the storage unit 13b. In a case where the overlay or alignment measurement recipe is used for the first time (Yes in step S2), the controller 13 proceeds to perform step S3. In a case where the overlay or alignment measurement is not used for the first time (No in step S2), the controller 13 proceeds to perform step S22.

Figure 4A:
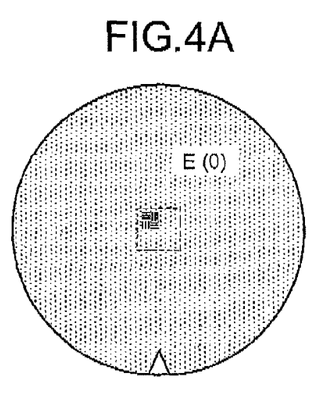
FIGS. 4A and 4B are diagrams illustrating an overlay or alignment measurement method according to an embodiment.

In step S3, the measurement controller 13a of the controller 13 causes the driver 12 to rotate the wafer stage 1 around the Z axis so as to direct the notch (a mark corresponding to a notched portion of the wafer WF) downward (in a direction of 0°) (see FIG. 4A).

In step S4, the measurement controller 13a controls measurement of the repeatability in the partial areas A1, B1, C1, D1, and E1 of the measurement area in the state in which the notch is directed downward.

Specifically, in the state in which the notch is directed downward, the measurement controller 13a sequentially causes the driver 12 to move the wafer stage 1 in the X direction and the Y direction to position the mark for overlay or alignment measurement AM1 on each of the partial areas A1, B1, C1, D1, and E1 of the measurement area. While sequentially causing the driver 12 to shift the relative position of the measurement area to the mark for overlay or alignment measurement AM1 in that way, the measurement controller 13a preliminarily controls measurement of the amount of overlay or alignment shift of the mark for overlay or alignment measurement AM1 for each of the partial areas A1, B1, C1, D1, and E1 with respect to the state in which the notch is directed downward a plurality of times.

On the basis of the amount of overlay or alignment shift preliminarily measured a plurality of times by control of the measurement controller 13a, the operation unit 11a calculates the repeatability for each of the partial areas A1, B1, C1, D1, and E1 (see FIG. 5). For example, the repeatability Rep is an error component in which a distribution of the measured values calculated by measuring the amount of overlay or alignment shift the plurality of times is 3σ (three times a standard deviation). For example, the operation unit 11a calculates each of the Rep(A1), Rep(B1), Rep(C1), Rep(D1), and Rep(E1) of the plurality of partial areas A1, B1, C1, D1, and E1 (see FIG. 5).

In step S5, the measurement controller 13a controls measurement of the amount of overlay or alignment shift of the mark for overlay or alignment measurement AM1 a plurality of times for the partial areas A2, B2, C2, D2, and E2 of the measurement area in the state in which the notch is directed downward, similar to step S4, and the operation unit 11a calculates (measures) the repeatability by performing calculation similar to step S4.

In step S6, the measurement controller 13a controls measurement of the amount of overlay or alignment shift of the mark for overlay or alignment measurement AM1 a plurality of times for the partial areas A3, B3, C3, D3, and E3 of the measurement area in the state in which the notch is directed downward, similar to step S4, and the operation unit 11a calculates (measures) the repeatability by performing calculation similar to step S4.

In step S7, the measurement controller 13a controls measurement of the amount of overlay or alignment shift of the mark for overlay or alignment measurement AM1 a plurality of times for the partial areas A4, B4, C4, D4, and E4 of the measurement area in the state in which the notch is directed downward, similar to step S4, and the operation unit 11a calculates (measures) the repeatability by performing calculation similar to step S4.

In step S8, the measurement controller 13a controls measurement of the amount of overlay or alignment shift of the mark for overlay or alignment measurement AM1 a plurality of times for the partial areas A5, B5, C5, D5, and E5 of the measurement area in the state in which the notch is directed downward, similar to step S4, and the operation unit 11a calculates (measures) the repeatability by performing calculation similar to step S4.

Figure 4B:
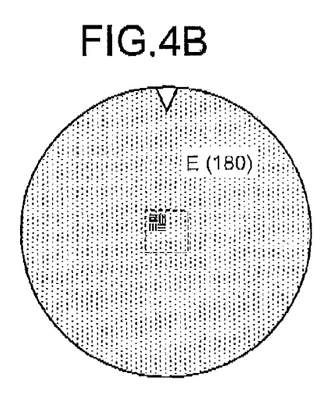

In step S9, the measurement controller 13a causes the driver 12 to rotate the wafer stage 1 180° around the Z axis from the state in the notch is directed downward (in the direction of 0°) so as to direct the notch upward (in a direction of 180°) (see FIG. 4B).

In step S10, the measurement controller 13a controls measurement of the amount of overlay or alignment shift of the mark for overlay or alignment measurement AM1 a plurality of times for the partial areas A1, E1, C1, D1, and E1 of the measurement area in the state in which the notch is directed upward, similar to step S4, and the operation unit 11a calculates (measures) the repeatability by performing calculation similar to step S4.

In step S11, the measurement controller 13a controls measurement of the amount of overlay or alignment shift of the mark for overlay or alignment measurement AM1 a plurality of times for the partial areas A2, B2, C2, D2, and E2 of the measurement area in the state in which the notch is directed upward, similar to step S4, and the operation unit 11a calculates (measures) the repeatability by performing calculation similar to step S4.

In step S12, the measurement controller 13a controls measurement of the amount of overlay or alignment shift of the mark for overlay or alignment measurement AM1 a plurality of times for the partial areas A3, B3, C3, D3, and E3 of the measurement area in the state in which the notch is directed upward, similar to step S4, and the operation unit 11a calculates (measures) the repeatability by performing calculation similar to step S4.

In step S13, the measurement controller 13a controls measurement of the amount of overlay or alignment shift of the mark for overlay or alignment measurement AM1 a plurality of times for the partial areas A4, B4, C4, D4, and E4 of the measurement area in the state in which the notch is directed upward, similar to step S4, and the operation unit 11a calculates (measures) the repeatability by performing calculation similar to step S4.

In step S14, the measurement controller 13a controls measurement of the amount of overlay or alignment shift of the mark for overlay or alignment measurement AM1 a plurality of times for the partial areas A5, B5, C5, D5, and E5 of the measurement area in the state in which the notch is directed upward, similar to step S4, and the operation unit 11a calculates (measures) the repeatability by performing calculation similar to step S4.

In step 15, the operation unit 11a of the process operation device 11 calculates the tool-induced shift for each of the plurality of partial areas A1 to E5 from the measured results of the amount of overlay or alignment shift in the state in which the notch is directed downward (steps S4 to S8) and the measured results of the amount of overlay or alignment measurement in state in which the notch is directed upward (steps 10 to 14) (see FIG. 5). For example, the tool-induced shift (TIS) is an error component regarding the coma aberration of the lens (not shown) in the optical microscope.

Specifically, with respect to each of the partial areas A1 to E5, if the amount of overlay or alignment shift measured in the state in which the notch is directed downward is E(0), and the amount of overlay or alignment shift measured in the state in which the wafer rotates 180° around the Z axis from the state in which the notch is directed downward (the notch is directed upward) is E (180), the operation unit 11a calculates the TIS by Equation 1. In this way, the operation unit 11a calculates, for example, each of the TIS(A1) to TIS(E5) of the plurality of partial areas A1 to E5 (see FIG. 5).

In step S16, the operation unit 11a determines whether there are a plurality of overlay or alignment measurement apparatuses or not. The operation unit 11a may obtain the information on whether there is another overlay or alignment measurement apparatus or not by inquiring of another overlay or alignment measurement apparatus and receiving the response, for example, via a communication line through a communication interface (not shown), or may obtain the information on whether there is another overlay or alignment measurement apparatus or not by the input of the user through a user interface (not shown). In a case where another overlay or alignment measurement apparatus does not exist, that is, there is only one overlay or alignment measurement apparatus (No in step S16), the operation unit 11a proceeds to perform step 17. In a case where another overlay or alignment measurement apparatus exists, that is, there are a plurality of overlay or alignment measurement apparatuses (Yes in step S16), the operation unit 11a proceeds to perform step S18.

In step S17, the operation unit 11a calculates the total measurement uncertainty as the determination indicator of the accuracy of measurement for each of the plurality of partial areas A1 to E5, from the tool-induced shift (TIS) and the repeatability (Rep) (see FIG. 5). For example, the total measurement uncertainty (TMU) is calculated by totally combining the above-mentioned individual error components in overlay or alignment measurement.

Specifically, when measured values of the TIS and the Rep for each of the partial areas A1 to E5 are referred to as TIS and Rep, respectively, the operation unit 11a calculates the TMU by Equation 3.

In step S18, the operation unit 11a calculates the tool matching for each of the plurality of partial areas A1 to E5, on the basis of the amount of overlay or alignment shift measured by the reference optical measurement system (not shown) and calculated in advance, and the amount of overlay or alignment shift preliminarily measured under the control of the measurement controller 13e as described above. The reference optical measurement system is the optical measurement system provided to the reference overlay or alignment measurement apparatus (apparatus No. 1). Information on the amount of overlay or alignment shift measured by the reference optical measurement system may be acquired by questioning the reference overlay or alignment measurement apparatus via a communication line through a communication interface (not shown), or may be user's input through a user interface (not shown).

For example, the tool matching (Mat) is expressed by the difference between the measured value of the amount of overlay or alignment shift by the reference optical measurement system and the measured value of the amount of overlay or alignment shift by the measurement controller 13a in the case of measuring the same mark for overlay or alignment measurement. For example, the operation unit 11a calculates each of Mat (A1) to Mat (E5) of the plurality of partial areas A1 to E5 (see FIG. 5).

In step S19, the operation unit 11a calculates the total measurement uncertainty as the determination indicator of the accuracy of measurement for each of the plurality of partial areas A1 to E5, from the tool-induced shift (TIS), the repeatability (Rep), and the tool matching (Mat) (see FIG. 5). For example, the total measurement uncertainty (TMU) is calculated by totally combining the above-mentioned individual error components in overlay or alignment measurement.

Specifically, when measured values of the TIS, the Rep, and the Mat for each of the partial areas A1 to E5 are referred to as TIS, Rep, and Mat, respectively, the operation unit 11a calculates the TMU by Equation 2.

In step S20, the determining unit 11b determines (decides) a partial area with the smallest total measurement uncertainty (TMU) of the plurality of partial areas A1 to E5, as the partial area to be used. For example, in a case where the TMU(E5) is the smallest among the total measurement uncertainties TMU (A1) to TMU(E5) of the plurality of partial areas A1 to E5, the determining unit 11b determines the partial area E5 corresponding to the TMU(E5), as the partial area to be used. The determining unit 11b provides information on the partial area to be used to the controller 13.

In step S21, the controller 13 receives the information on the partial area to be used from the determining unit 11b, and updates the overlay or alignment measurement recipe stored in the storage unit 13b according to the information on the partial area to be used.

In step S22, the measurement controller 13a of the controller 13 causes the driver 12 to drive the wafer stage 1 so as to position the mark for overlay or alignment measurement AM1 on the partial area determined to be used (for example, the partial area E5) (for example, such that a relative position relationship shown in FIG. 3D by the dashed-two dotted line is established) with reference to the updated overlay or alignment measurement recipe stored in the storage unit 13b when measuring the amount of overlay shift between the layers. Therefore, in the state where the measurement controller 13a causes the driver 12 to shift the relative position of the measurement area to the mark for overlay or alignment measurement AM1 so as to position the mark for overlay or alignment measurement AM1 on the partial area determined to be used in advance, the optical microscope 7 acquires an optical image of the mark for overlay or alignment measurement AM1 and performs measurement of the amount of overlay or alignment shift of the mark for overlay or alignment measurement AM1.

Further, the above-mentioned process is similar in the case of using any another of other marks for overlay or alignment measurement AM2 to AM8 of the plurality of marks for overlay or alignment measurement AM1 to AM8 in the shot area SH to perform overlay or alignment measurement. The above-mentioned process is performed again in a case where the used mark for overlay or alignment measurement is changed. Further, the above-mentioned process is performed for every lithographic process in a method of manufacturing a semiconductor device, every overlay or alignment measurement apparatus, every shot area used for overlay or alignment measurement, and every mark for overlay or alignment measurement. The partial area determined in step S20 to be used may be common to shot areas on the same wafer, or may depend on shot areas on the same wafer.

Figure 6A:
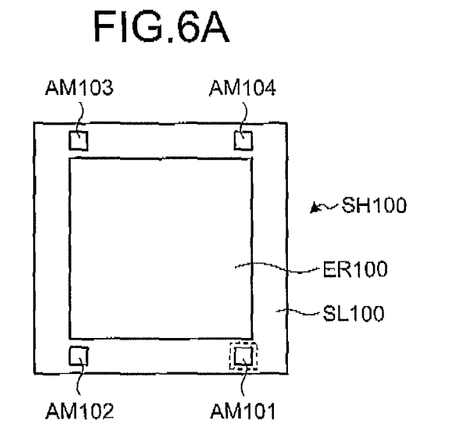
FIGS. 6A to 6D are diagrams illustrating an overlay or alignment measurement method according to a comparative example.
Figure 6B:
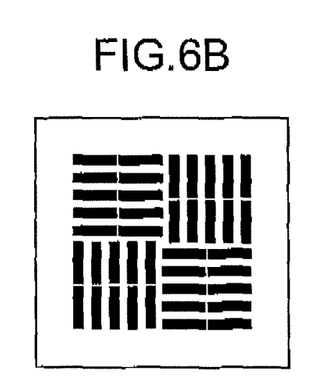

Here, consider a case where the size of each mark for overlay or alignment measurement AM101, AM102, AM103, or AM104 in a shot area 100 is the almost same as the size of measurement area corresponding to the field angle of the optical microscope 7 as indicated by a broken line in FIG. 6A. The size of the coma aberration of the lens of the optical microscope 7 has a distribution (location dependency) in the measurement area as shown in FIG. 6D. For example, in a case shown in FIG. 6D, in the measurement area, the influence of the coma aberration is greatest in a white area ranging from a top right corner to a bottom left corner, and the influence of the coma aberration decreases toward a dark grey area ranging from the bottom right corner or the top left corner (as the color is deepened). In this case, as shown in FIG. 6B, the size of the mark for overlay or alignment measurement AM101 is the almost same as the size of the measurement area and the mark for overlay or alignment measurement AM101 extends both over the area greatly influenced by the coma aberration and the area little influenced by the coma aberration. Therefore, in a case of measuring the amount of overlay shift between the layers by using the mark for overlay or alignment measurement AM101, there is a tendency that the influence of the coma aberration is averaged so that the influence of the coma aberration on the accuracy of overlay or alignment measurement is small. However, since the size of the marks for overlay or alignment measurement AM101 to 104 is large, the number of marks for overlay or alignment measurement disposable on a scribe line SL100 (around an exposure area ER100) in a shot area SH100 is limited (to 4 in a case of FIG. 6A).

In contrast, in the embodiment, as shown in FIGS. 3B and 3D, the size of marks for overlay or alignment measurement AM1 to AM8 in the shot area SH is considerably smaller than the size of the measurement area. Therefore, it is possible to easily increase the number of (8 in a case of FIG. 3B) marks for overlay or alignment measurement disposable on the scribe line SL in the shot area SH, and to increase the number of sampling points. Accordingly, it is possible to improve the accuracy of overlay or alignment measurement.

Figure 6C:
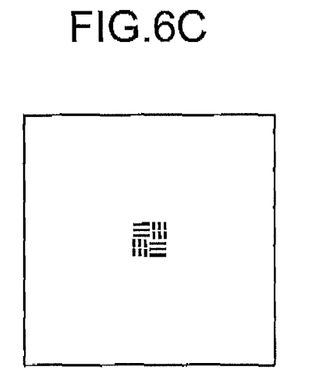
Figure 6D:
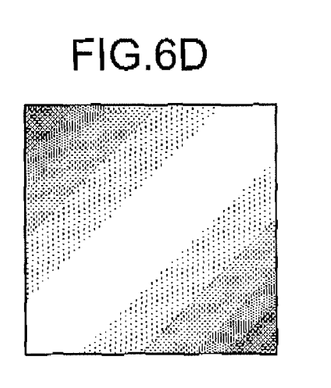

Also, consider a case in which the size of the mark for overlay or alignment measurement is considerably smaller than the size of the measurement area and overlay or alignment measurement is performed in a state in which the mark for overlay or alignment measurement is always located in the center of the measurement area as shown in FIG. 6C. In this case, as shown in FIGS. 6C and 6D, the mark for overlay or alignment measurement is located in the area greatly influenced by the coma aberration. Therefore, in a case of measuring the amount of overlay shift between the layers by using the mark for overlay or alignment measurement, there is a possibility that an optical image of the mark for overlay or alignment measurement shifts by the coma aberration so as to increase an error of the overlay or alignment measurement.

In contrast, in the embodiment, in steps S1 to S14, preliminary overlay or alignment measurement is performed while the relative position between the mark for overlay or alignment measurement and the measurement area sequentially shifts so as to position the mark for overlay or alignment measurement on each of the plurality of partial areas A1 to E5 into which the inside of the measurement area is two-dimensionally divided. In step S15, the TIS (tool-induced shift) regarding the coma aberration (characteristic deviation) of the lens of the optical microscope (optical measurement system) 7 is calculated for each of the partial areas A1 to E5. In step S20, the partial area (for example, the partial area E5) in which the indicator corresponding to the TIS (tool-induced shift) is smallest is determined as the partial area to be used. In step S22, the mark for overlay or alignment measurement is located on the partial area determined in step S20 and overlay or alignment measurement is performed. Therefore, as shown in FIGS. 3C and 6D, it is possible to perform overlay or alignment measurement in a state in which the mark for overlay or alignment measurement is located on a partial area, least influenced by the coma aberration, in the measurement area. As a result, even in a case where the size of the mark for overlay or alignment measurement is considerably smaller than the size of the measurement area, it is possible to reduce the influence of the coma aberration on the accuracy of overlay or alignment measurement, and thus to improve the accuracy of the overlay Or alignment measurement.

Further, in the embodiment, in step S18, the Mat (tool matching) regarding the difference (deviation amount) between the measured value of the amount of overlay or alignment shift by the optical microscope (optical measurement system) 7 and the measured value of the amount of overlay or alignment shift by the reference optical microscope (reference optical measurement system) is calculated for each of the partial areas A1 to E5. Therefore, in step 319, it is possible to calculate the TMU (total measurement uncertainty) by adding the Mat (tool matching). Accordingly, it is possible to perform overlay or alignment measurement in a state in which the mark for overlay or alignment measurement is located on a partial area, least influenced by the coma aberration and the Mat (tool matching), in the measurement area. As a result, it is possible to reduce the influence of the coma aberration and the tool matching on the accuracy of overlay or alignment measurement. Even from this point, it is possible to improve the accuracy of the overlay or alignment measurement.

Furthermore, in the embodiment, in steps S1 to S14, the amount of overlay or alignment shift is measured a plurality of times and the Rep (repeatability) regarding the distribution of the measured values calculated by measuring the amount of overlay or alignment shift a plurality of times (the reproducibility of the amount of overlay or alignment shift) is calculated for each of the partial areas A1 to E5. Therefore, in step S19, it is possible to calculate the TMU (total measurement uncertainty) by adding the repeatability. Accordingly, it is possible to perform overlay or alignment measurement in a state in which the mark for overlay or alignment measurement is located on a partial area, least influenced by the coma aberration and the repeatability, in the measurement area. As a result, it is possible to reduce the influence of the coma aberration and the repeatability on the accuracy of overlay or alignment measurement. Even from this point, it is possible to improve the accuracy of the overlay or alignment measurement.

Moreover, in the embodiment, in a case where there is only one overlay or alignment measurement apparatus and it is possible to set the Mat (tool matching) to 0, in step S17, the TMU (total measurement uncertainty) for each of the partial areas A1 to E5 is calculated from the TIS (tool-induced shift) and the Rep (repeatability). In a case where there are a plurality of overlay or alignment measurement apparatuses, in step S19, the TMU (total measurement uncertainty) for each of the partial areas A1 to E5 is calculated from the TIS (tool-induced shift), the Rep (repeatability), and the Mat (tool matching). Therefore, in step S20, it is possible to calculate the total measurement uncertainty of the overlay or alignment measurement by considering all of the tool-induced shift, the repeatability, and the tool matching. Accordingly, it is possible to perform overlay or alignment measurement in a state in which the mark for overlay or alignment measurement is located on a partial area, in which the total influence of the coma aberration, the repeatability, and the tool matching is smallest, in the measurement area. As a result, it is possible to reduce the total influence of the coma aberration, the repeatability, and the tool matching on the accuracy of overlay or alignment measurement. Even from this point, it is possible to improve the accuracy of the overlay or alignment measurement.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An overlay measurement method of measuring an amount of overlay shift by acquiring an optical image of an overlay measurement mark selected among a plurality of overlay measurement marks formed on a substrate by an optical measurement system, the overlay measurement method comprising:

sequentially shifting a substrate position relative to the optical measurement system such that a position of a field angle area relative to the overlay measurement mark is sequentially shifted so as to position the overlay measurement mark on each of a plurality of partial areas of the field angle area without positioning another overlay measurement mark in the field angle area, the field angle area being an area included in a field angle of the optical measurement system, and the plurality of partial areas being determined by two-dimensionally dividing the field angle area;

every time the shifting is performed so that the overlay measurement mark is positioned on another partial area out of the plurality of partial areas, performing a preliminary overlay measurement, the preliminary overlay measurement measuring, without using a mark on a reticle, a preliminary amount of overlay shift of the overlay measurement mark on the substrate while the overlay measurement mark is positioned on the partial area, the overlay shift being a shift induced by an optical characteristic deviation of the optical measurement system and representing a shift amount between a plurality of layers formed on the substrate, the preliminary overlay measurement includes measuring the preliminary amount of overlay shift for a plurality of times for each of the plurality of partial areas;

calculating a tool-induced shift regarding the optical characteristic deviation for each of the plurality of partial areas based on the preliminary amount of overlay shift;

calculating a repeatability regarding reproducibility of the preliminary amount of overlay shift, for each of the plurality of partial areas, based on the plurality of times of preliminary amount of overlay shift;

calculating a total measurement uncertainty for each of the plurality of partial areas from at least the calculated tool-induced shift and the calculated repeatability, determining a partial area with the smallest total measurement uncertainty of the plurality of partial areas as a partial area to be used from among the plurality of partial areas on the basis of the calculated total measurement uncertainty; and measuring the amount of overlay shift of the overlay measurement mark in a state in which the position of the field angle area relative to the overlay measurement mark is set such that the overlay measurement mark is located on the partial area determined to be used.

2. The overlay measurement method according to claim 1, wherein the field angle area has a size with which plural overlay measurement marks are capable of being present, and the field angle area is divided into the plurality of partial areas according to a size of the overlay measurement mark.

3. The overlay measurement method according to claim 1, wherein the preliminary overlay measurement includes preliminarily measuring a first preliminary amount of overlay shift of the overlay measurement mark while sequentially shifting the position of the field angle area in a state in which the substrate is directed in a first direction, and preliminarily measuring a second preliminary amount of overlay shift of the overlay measurement mark while sequentially shifting the position of the field angle area in a state in which the substrate is directed in a second direction.

4. The overlay measurement method according to claim 3, wherein, the tool-induced shift is calculated, on the basis of the first preliminary amount of overlay shift and the second preliminary amount of overlay shift.

5. The overlay measurement method according to claim 4, wherein the tool-induced shift is calculated by averaging the first preliminary amount of overlay shift and the second preliminary amount of overlay shift.

6. The overlay measurement method according to claim 1, wherein the tool-induced shift includes an error component regarding coma aberration of a lens of the optical measurement system.

7. The overlay measurement method according to claim 1, further comprising:

calculating a tool matching regarding a deviation amount of the optical measurement system relative to a reference optical measurement system for each of the plurality of partial areas, based on the preliminary amount of overlay shift.

8. The overlay measurement method according to claim 7, further comprising:

determining whether a plurality of overlay measurement apparatuses exist, wherein, in a case where one overlay measurement apparatus exists, the tool matching is set to 0, and in a case where a plurality of overlay measurement apparatuses exist, the tool matching is calculated, on the basis of a reference amount of overlay shift measured by the reference optical measurement system of a reference overlay measurement apparatus, and the amount of overlay shift measured by the optical measurement system.

9. The overlay measurement method according to claim 8, wherein, in the case where a plurality of overlay measurement apparatuses exist, the tool matching is calculated by calculating a difference between the reference amount of overlay shift and the amount of overlay shift measured by the optical measurement system.

10. The overlay measurement method according to claim 1, wherein the repeatability includes an error component in which a distribution of the preliminary amount of overlay shift measured the plurality of times is associated with a standard deviation.

11. The overlay measurement method according to claim 1, further comprising:

determining whether a plurality of overlay measurement apparatuses exist, wherein, in a case where one overlay measurement apparatus exists, a total measurement uncertainty for each of the plurality of partial areas is calculated from the tool-induced shift and the repeatability, and in a case where a plurality of overlay measurement apparatuses exist, a total measurement uncertainty for each of the plurality of partial areas is calculated from the tool-induced shift, the tool matching, and the repeatability.

12. An overlay measurement apparatus measuring an amount of overlay shift in a substrate, comprising:

an optical measurement system configured to acquire an optical image of an overlay measurement mark selected among a plurality of overlay measurement marks formed on the substrate;

a substrate stage configured to hold the substrate;

a measurement controller configured to:

sequentially shift a substrate position relative to the optical measurement system such that a position of a field angle area relative to the overlay measurement mark is sequentially shifted so as to position the overlay measurement mark on each of a plurality of partial areas of the field angle area without positioning another overlay measurement mark in the field angle area, the field angle area being an area included in a field angle of the optical measurement system, and the plurality of partial areas being determined by two-dimensionally dividing the field angle area, perform a preliminary overlay measurement every time the shift is performed so that the overlay measurement mark is positioned on another partial area out of the plurality of partial areas, the preliminary overlay measurement measuring, without using a mark on a reticle, a preliminary amount of overlay shift of the overlay measurement mark on the substrate for each of the plurality of partial areas while the overlay measurement mark is located on the partial area, the overlay shift being a shift induced by an optical characteristic deviation of the optical measurement system and representing a shift amount between a plurality of layers formed on the substrate, the preliminary overlay measurement including measuring the preliminary amount of overlay shift for a plurality of times for each of the plurality of partial aeras;

an operation unit configured to calculate a tool-induced shift regarding the optical characteristic deviation for each of the plurality of partial areas, based on the preliminary amount of overlay shift, to calculate a repeatability regarding reproducibility of the preliminary amount of overlay shift for each of the plurality of partial areas based on the plurality of times of preliminary amount of overlay shift, and to calculate a total measurement uncertainty for each of the plurality of partial areas from at least the calculated tool-induced shift and the calculated repeatability; and a determining unit configured to determine a partial area with the smallest total measurement uncertainty of the plurality of partial areas as a partial area to be used from among the plurality of partial areas, on the basis of the calculated total measurement uncertainty.

13. The overlay measurement apparatus according to claim 12, wherein the measurement controller is further configured to:
    move the substrate stage so as to position the overlay measurement mark on the partial area determined to be used, and
    control the optical measurement system to acquire the optical image of the overlay measurement mark to perform an overlay measurement.

14. The overlay measurement apparatus according to claim 12,
    wherein the measurement controller controls a first preliminary measurement of a first preliminary amount of overlay shift of the overlay measurement mark while controlling the sequential shift of the position of the field angle area in a state in which the substrate is directed in a first direction, and further controls a second preliminary measurement of a second preliminary amount of overlay shift of the overlay measurement mark while controlling the sequential shift of the position of the field angle area in a state in which the substrate is directed in a second direction.

15. The overlay measurement apparatus according to claim 12,
    wherein the operation unit further calculates a tool matching regarding a deviation amount of the optical measurement system relative to a reference optical measurement system for each of the plurality of partial areas based on the preliminary amount of overlay shift.

* * * * *